United States Patent [19]

Tsuji

[11] Patent Number: 4,959,116

[45] Date of Patent: Sep. 25, 1990

[54] PRODUCTION OF METAL BASE LAMINATE PLATE INCLUDING APPLYING AN INSULATOR FILM BY POWDER COATING

[75] Inventor: Masato Tsuji, Iwaki, Japan

[73] Assignee: Alps Electric Co., Ltd., Tokyo, Japan

[21] Appl. No.: 307,862

[22] Filed: Feb. 7, 1989

[30] Foreign Application Priority Data

Mar. 24, 1988 [JP] Japan .................................. 63-68201

[51] Int. Cl.$^5$ ...................... B29C 65/18; B29C 65/52
[52] U.S. Cl. .................................. 156/283; 29/848;
156/290; 156/307.7
[58] Field of Search ...................... 156/87, 91, 92, 151,
156/182, 252, 256, 283, 290, 307.7, 630, 632,
634, 322; 29/831, 846, 848, 849

[56] References Cited

U.S. PATENT DOCUMENTS

| | | | |
|---|---|---|---|
| 2,517,698 | 8/1950 | Muskat | 156/87 |
| 2,716,268 | 8/1955 | Steigerwalt | 29/848 |
| 2,890,147 | 6/1959 | Pearson et al. | 156/283 |
| 4,087,300 | 5/1978 | Adler | 156/307.7 |

FOREIGN PATENT DOCUMENTS

| | | | |
|---|---|---|---|
| 0012094 | 7/1980 | European Pat. Off. | 29/848 |
| 54-125283 | 9/1979 | Japan | 156/307.7 |
| 0092849 | 5/1986 | Japan | |
| 62-221528 | 9/1987 | Japan | 156/92 |
| 63-173623 | 7/1988 | Japan | 156/91 |

Primary Examiner—Michael W. Ball
Assistant Examiner—Steven D. Maki
Attorney, Agent, or Firm—Guy W. Shoup; Paul J. Winters

[57] ABSTRACT

A process of producing a metal base laminate plate wherein the productivity and the yield are high. The process comprises the steps of applying an insulator film by powder coating to a metal plate having a through-hole formed therein to form a metal base plate, placing a film base plate having a heat resisting property in position on the metal base plate with a thermosetting adhering sheet interposed therebetween, pressurizing and heating part of a layered body consisting of the metal base plate, adhering sheet and film base plate to temporarily adhere the metal base plate and the film base plate to each other, and introducing the layered body in a predetermined orientation into a pair of pressuring and heating rollers to finally adhere the metal base plate and the film base plate to each other. When a layered body of a metal base plate and a film base plate passes the pressurizing and heating rollers, air is driven out of them. Consequently, little air bubbles remain in a metal base laminate plate produced by the process.

3 Claims, 4 Drawing Sheets

PRODUCTION OF METAL BASE LAMINATE PLATE INCLUDING APPLYING AN INSULATOR FILM BY POWDER COATING

BACKGROUND OF THE INVENTION

1. Field of the Invention

This invention relates to a process of producing a metal base laminate plate which is used as a printed circuit board for a keyboard device or a like device.

2. Description of the Prior Art

A keyboard device which is used as an input device for a personal computer, a word processor or the like normally incorporates therein a printed circuit board having a large number of through-holes perforated therein in which terminals of various key switches are fitted. In recent years, so-called metal base laminate plates which include a base of a metal plate coated with an insulator film are used by a progressively increasing quantity for such printed circuit boards. Since a metal base laminate plate includes a metal plate of iron, aluminum or some other suitable metal as a base, it is advantageous in that it can be bent readily and it has a high heat radiating effect and a high magnetic shielding effect. Accordingly, it can be estimated that demands for metal base laminate plates will further increase in the future.

FIG. 7 shows, in partial cross section, a conventional metal base laminate plate. Referring to FIG. 7, a metal base laminate plate 1 is principally composed of a metal plate 2 made of a metal such as iron or aluminum and having a large number of perforations 2a formed at predetermined locations thereof, an insulator film 3 coated on the metal plate 2, and a copper foil pattern 4 formed on a surface of the insulator film 3. Each of the perforations 2a of the metal plate 2 is coated at an inner wall thereof with the insulator film 3 to thus form a through-hole 5. Solder resist 6 is printed on a surface of the copper foil pattern 4 except lands. It is to be noted that the insulator film 3 is formed by pressurizing and heating a prepreg which is formed from a paper sheet or a glass fiber sheet in which a resin such as a phenolic resin is impregnated.

A process of producing such a metal base laminate plate 1 as described above is disclosed, for example, in Japanese Patent Laid-Open No. 61-92849. According to the process, a metal plate 2 in which a large number of perforations 2a are formed at predetermined locations is prepared, and a pair of prepregs are placed on the opposite faces of the metal plate 2. Then, a sheet of copper foil is placed on a surface of one of the prepregs, and a layered body of them is pressurized and heated to shape the same into a unitary member. In this instance, the perforations 2a are filled up by resin material flowed out of the prepregs, and as the resin in the prepregs cures, the insulating film 3 is formed. Subsequently, the copper foil is subjected to etching or the like to form the copper foil pattern 4, and then the solder resist 6 is printed on the surface of the copper foil pattern 4 except lands. After then, the resin material filled in the perforations 2a of the metal plate 2 is removed by boring by means of a drill or a like tool to form the through-holes 5. Finally, bending is performed using a twin roll bending machine or the like to complete the metal base laminate plate 1 of a predetermined configuration.

With the conventional process of production described above, however, the working efficiency is low and it is difficult to improve the productivity because a press step for a period of 30 minutes or so under a reduced pressure is required in order to form the insulator film 3 by pressurizing and heating the prepregs. Further, since air admitted in between the prepreg and the copper foil cannot be removed completely by such a pressing step, air bubbles may remain by a significant amount in the metal base laminate plate 1. Consequently, there is the possibility that the copper foil pattern 4 may be exfoliated from the insulator film 3, and accordingly the yield is low.

SUMMARY OF THE INVENTION

It is an object of the present invention to provide a process of producing a metal base laminate plate wherein the productivity and the yield are high.

In order to attain the object, according to the present invention, there is provided a process of producing a metal base laminate plate, which comprises the steps of applying an insulator film by powder coating to a metal plate having a through-hole formed therein to form a metal base plate, placing a film base plate having a heat resisting property in position on the metal base plate with a thermosetting adhering sheet interposed therebetween, pressurizing and heating part of a layered body consisting of the metal base plate, adhering sheet and film base plate to temporarily adhere the metal base plate and the film base plate to each other, and introducing the layered body in a predetermined orientation into a pair of pressuring and heating rollers to finally adhere the metal base plate and the film base plate to each other.

With the process, a metal base plate having an insulating film and a through-hole can be obtained only by applying powder coating for a very short period of time to a metal plate having a perforation formed therein, and the step of adhering the metal base plate and a film base plate to each other is performed, after the temporarily adhering step, by introducing them in a predetermined orientation into a pair of pressurizing and heating rollers. Accordingly, they can be adhered to each other in a short period of time comparing with a conventional pressing step. Besides, since air is driven out of a layered body of the metal base plate and the film base plate when it passes the pressurizing and heating rollers, little air bubbles remain in the layered body after the final adhering step. Accordingly, comparing with a conventional process of production, the productivity is improved remarkably and the yield is improved. Consequently, metal base laminate plates of a high reliability can be provided at a low cost.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 4:
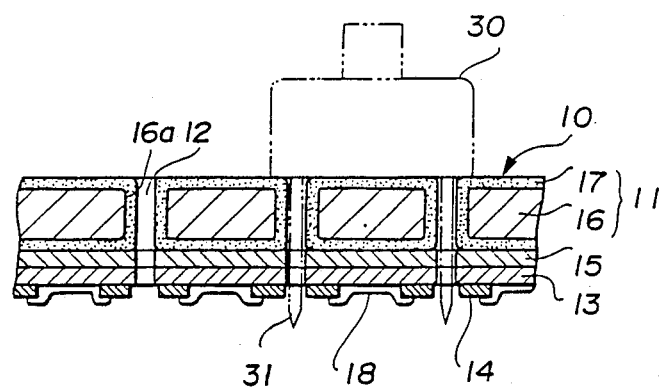
FIG. 4 is a partial sectional view of a metal base laminate plate produced by the process of the present invention.
Figure 5:
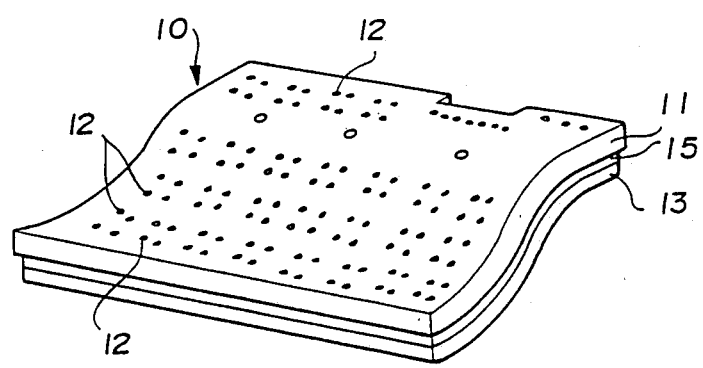
FIG. 5 is a perspective view, in a reduced scale, of the metal base laminate plate of FIG. 4.

Referring first to FIGS. 4 and 5, there is shown a metal base laminate plate 10 produced by a process according to the present invention. The metal base laminate plate 10 is produced as a printed circuit board for a keyboard device and is principally composed of a metal base plate 11 having a large number of through-holes 12 formed therein, a film base plate 13 having a copper foil pattern 14 formed on a surface thereof, and an adhering layer 15 interposed between the metal base plate 11 and the film base plate 13 to adhere them to each other.

The metal base plate 11 is composed of a metal plate 16 such as a steel plate having perforations 16a for the through-holes 12 formed therein, and an insulator film 17 applied to the metal plate 16 by electrostatic powder coating of plastic powder. In the case of the metal base laminate plate 10 shown, the thickness of the metal plate 16 is 0.8 mm or so, and the thickness of the insulator film 17 is 100 microns or so. Meanwhile, plastic powder used for the electrostatic powder coating for the metal base laminate plate 10 is powder of an epoxy resin.

The film base plate 13 is formed by patterning copper foil of a conventional copper-applied laminate sheet having a flexibility and a heat resisting property, and in the case of the metal base laminate plate 10 shown, COSMOFLEX AH 1120 (125 microns thick) produced by Toyobo Kabushiki Kaisha is used as the copper-applied laminate sheet. It is to be noted that solder resist 18 is printed on a surface of the copper foil pattern 14 of the film base plate 13 except lands.

The adhering layer 15 is formed by pressurizing and heating a conventional thermosetting adhering sheet, and in the case of the metal base laminate plate 10 shown, T-5310 (150 microns thick) produced by Nitto Denko Kabushiki Kaisha is used as the adhering sheet.

Figure 1:
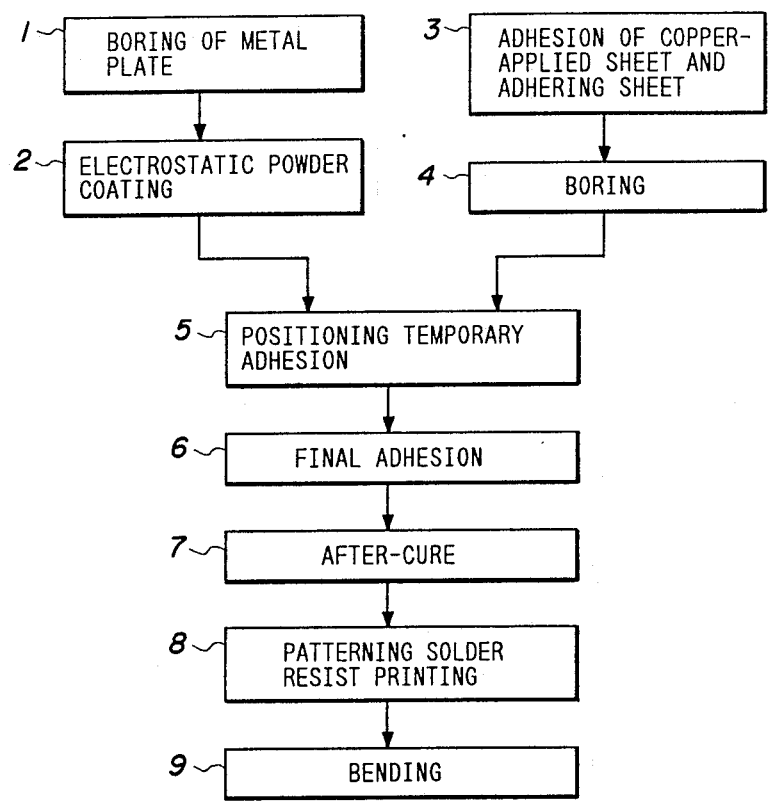
FIG. 1 is a block diagram illustrating a process of producing a metal base laminate plate according to an embodiment of the present invention.
Figure 2:
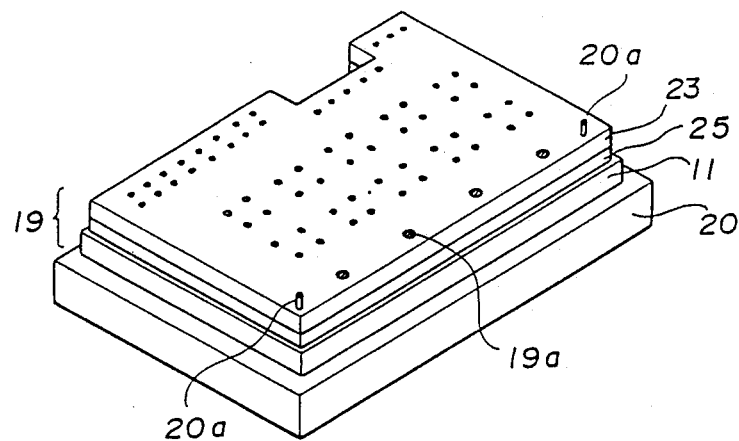
FIG. 2 is a perspective view illustrating a step of temporarily adhering a copper-applied laminate sheet to a metal base plate.

Referring now to FIG. 1, there is illustrated a process of producing such a metal base laminate plate 10 as described above.

At first, a metal plate is subjected to perforating processing using a numerically controlled punch or the like (step 1) to produce a metal plate 16 which have perforations 16a formed at predetermined locations thereof. Subsequently, the metal plate 16 is subjected to electrostatic powder coating to form an insulator film 17 of epoxy resin on the metal plate 16 (step 2), thereby obtaining a metal base plate 11 which has through-holes 12 formed at predetermined locations thereof.

It is to be noted that the electrostatic powder coating at step 2 proceeds generally as follows. In particular, powder of epoxy resin which is charged to the negative polarity at an exit of an injection gun is injected toward a metal plate 16 which is grounded so that the powder may be adhered to a surface of the metal plate 16 by an electrostatic attractive force, and then the metal base plate 16 is placed into a heating furnace so as to melt the epoxy resin. Consequently, an insulator film 17 can be obtained which is applied in a substantially uniform thickness to the metal plate 16 including inner wall faces of the perforations 16a.

On the other hand, in a side by side relationship to the steps 1 and 2 described above, a copper-applied laminate sheet and an adhering sheet prepared in advance are applied to each other using a hot roll laminator or the like (step 3), and then perforating processing is performed to form perforations at locations of the copper-applied laminate sheet and adhering sheet corresponding to the through-holes 12 using a numerically controlled drill or the like (step 4).

After then, the metal base plate 11 and the copper-applied laminate sheet 23 with the adhering sheet 25 are placed one on the other and positioned accurately on a positioning jig 20, and in this condition, a plurality of locations on an edge portion of the layered body 19 are pressurized and heated by an electric soldering iron or the like to temporarily adhere the metal plate 11 and the copper-applied laminate sheet 23 of the layered body 19 to each other (step 5). In this instance, the layered body 19 can be readily positioned by fitting positioning pins 20a of the positioning jig 20 into perforations formed in advance in the metal plate 16, copper-applied laminate sheet 23 and adhering sheet 25. Further, after such temporarily adhering blocks 19a are formed at a plurality of locations, the layered body 19 can be handled as a unitary member.

Figure 3:
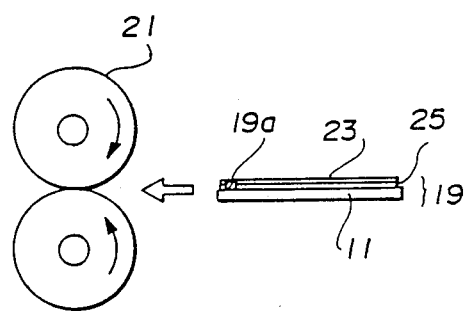
FIG. 3 is a schematic view illustrating a final adhering step.

Subsequently, the thus temporarily adhered layered body 19 is removed from the positioning jig 20, and then the layered body 19 is introduced from the temporarily adhered portions 19a side thereof into a hot roll laminator 21 as shown in FIG. 3 so that it may be heated at a temperature of 120° C. by the hot roll laminator 21 to finally adhere the metal plate 16 and the copper-applied laminate sheet 23 of the layered body 19 to each other (step 6). Consequently, the copper-applied laminate sheet 23 is adhered over an entire area thereof to the metal base plate 11, and little air bubbles will remain between them because air is driven out of them when they pass the hot roll laminator 21. After then, the layered body 19 is subjected to after-cure at a temperature of 160° C. within a drying furnace (step 7) to perfectly integrate the metal base plate 11 and the copper-applied laminate sheet 23 with each other with the adhering layer 15 (adhering sheet 25) interposed therebetween.

After the integrated layered body 19 including the metal plate 16 as a base is obtained, etching or the like is applied to a copper foil face of the layered body 19 to form a copper foil pattern 14 on the layered body 19, and solder resist 19 is printed on a surface of the copper foil pattern 14 except lands (step 8). In this instance, since the copper-applied laminate sheet 23 (film base plate 13) is adhered over an entire area thereof to the metal base plate 11, washing of the layered body 19 after etching will cause little wrinkling and will only result in a very low shrinkage factor of 0.01 percent or so.

Finally, bending of the layered body 19 is performed using a twin roll bending machine or the like (step 9), thereby completing a metal base laminate plate 10 having such a predetermined configuration as shown in FIG. 5. Then, when a part such as a key switch 30 is to be mounted on the metal base laminate plate 10, terminals 31 of the key switch 30 are inserted into the through-holes 12 of the metal base laminate plate 10 and soldered to lands on the metal base laminate plate 10.

As described above, according to the present embodiment, the metal base plate 11 having the insulating film 17 and the through-holes 12 is obtained only by applying electrostatic powder coating to the metal plate 16, and a desired layered structure is obtained only by adhering the metal base plate 11 and the copper-applied laminate sheet 23 to each other using the hot roll laminator 21. Accordingly, the working time required for pressurization and heating of a prepreg can be reduced and connection to preceding and following steps can be facilitated comparing with a conventional technique which requires a pressing step for a long period of time under a reduced pressure. Consequently, the productivity can be improved remarkably. Besides, since the layered body 19 is introduced from the temporarily adhered portions 19a side thereof into the hot roll laminator 21, air is driven out of the layered body 19 so that the metal base laminate plate 10 will contain little air bubbles therein. Accordingly, the yield is improved significantly.

Meanwhile, since in the present embodiment the copper foil pattern 14 is formed after the copper-applied laminate sheet 23 having a flexibility has been secured to the metal base plate 11, patterning can be effected with a normal etching line on the copper-applied laminate sheet 23 even where the copper-applied laminate sheet 23 has a large area. Accordingly, further improvement in productivity can be anticipated.

Figure 6:
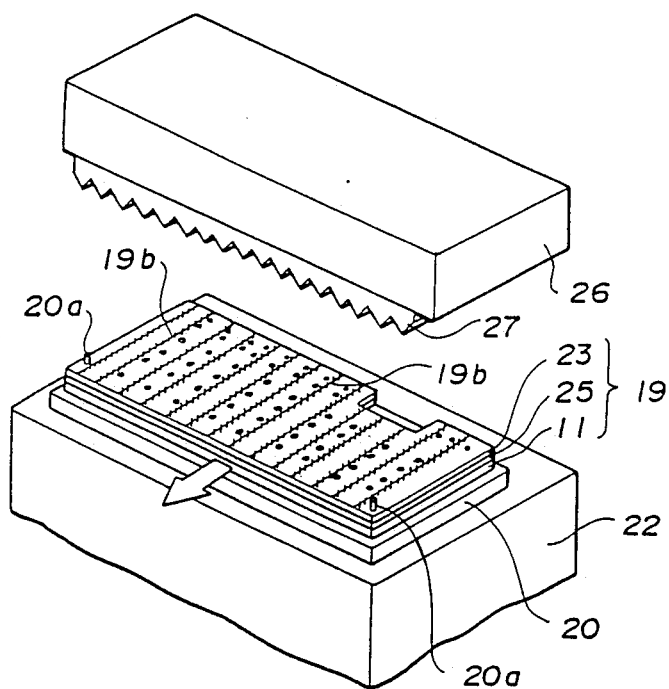
FIG. 6 is a perspective view illustrating a step of temporarily adhering a copper-applied laminate sheet to a metal base plate in a process of producing a metal base laminate plate according to another preferred embodiment of the present invention.
Figure 7:
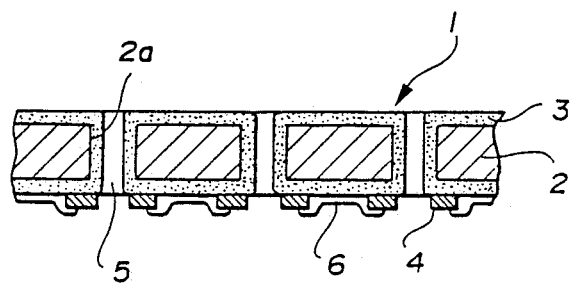
FIG. 7 is a partial sectional view of a metal base laminate plate produced by a conventional method of production.

Referring now to FIG. 6, there is illustrated a temporarily adhering step according to another preferred embodiment of the present invention. A layered body 19 consisting of a metal base plate 11 placed in an overlapping relationship on a copper-applied laminate sheet 23 with an adhering sheet 25 is positioned accurately by a positioning jig 20 placed on a support table 22, and then the layered body 19 is locally pressurized and heated by a corrugated silicon rubber plate 27 having a heat resisting property and mounted on a hot plate 26 to form a plurality of temporarily adhering portions 19b extending in a substantially parallel relationship to each other. Consequently, an air escaping path is defined between each adjacent ones of the temporarily adhering portions 19b of the layered body 19. Accordingly, if the layered body 19 is introduced in a longitudinal direction of the temporarily adhering portions 19b thereof (in the direction indicated by an arrow mark in FIG. 6) into a hot roll laminator, then air will be driven out of the layered body 19 through the air escaping paths. Consequently, little air bubbles will remain in the layered body 19 upon final adhesion of the metal base plate 11 and the copper-applied laminate sheet 23.

It is to be noted that the other steps of the present embodiment are similar to those of the preceding embodiment described above, and accordingly, description thereof is omitted herein to avoid redundancy.

Having now fully described the invention, it will be apparent to one of ordinary skill in the art that many changes and modifications can be made thereto without departing from the spirit and scope of the invention as set forth herein.

What is claimed is:

1. A process of producing a metal base laminate plate, comprising the steps of applying an insulator film by powder coating to a metal plate having a through-hole formed therein to form a metal base plate, placing a film base plate having a heat resisting property in position on said metal base plate with a thermosetting adhering sheet interposed therebetween to form a layered body, pressurizing and heating only part of said layered body to temporarily adhere said metal base plate and said film base plate to each other, and introducing said layered body in a predetermined orientation into a pair of pressuring and heating rollers to finally adhere said metal base plate and said film base plate to each other.

2. A process of producing a metal base laminate plate according to claim 1, wherein said layered body consisting of said metal base plate, adhering sheet and film base plate is temporarily adhered at an end portion thereof, and then said layered body is introduced from the temporarily adhered end portion thereof into said pair of pressurizing and heating rollers to finally adhere said metal base plate and said film base plate to each other.

3. A process of producing a metal base laminate plate according to claim 1, wherein said layered body consisting of said metal base plate, adhering sheet and film base plate is pressurized and heated at a plurality of spaced apart locations thereof to form a plurality of substantially parallel spaced, temporarily adhering portions, and then said layered body is introduced along a longitudinal direction of said spaced temporarily adhering portions into said pair of pressurizing and heating rollers to finally adhere said metal base plate and said film base plate to each other.

* * * * *